United States Patent [19]
Auvinen et al.

[11] Patent Number: 5,210,856
[45] Date of Patent: May 11, 1993

[54] NON-ALIGNED DRAM STATE MACHINE FOR PAGE-MODE DRAM CONTROL

[75] Inventors: Stuart Auvinen, Santa Cruz; Richard Sowell, San Jose, both of Calif.

[73] Assignee: Chips and Technologies, Inc., San Jose, Calif.

[21] Appl. No.: 741,778

[22] Filed: Aug. 7, 1991

[51] Int. Cl.⁵ .............................................. G06F 1/04
[52] U.S. Cl. .................................................. 395/550
[58] Field of Search .................. 364/DIG. 1, DIG. 2; 395/164, 165, 550, 275; 307/269

[56] References Cited
U.S. PATENT DOCUMENTS

4,615,017  9/1986  Finlay et al. .
4,835,733  5/1989  Powell .
4,970,418  11/1990  Masterson .
4,977,494  12/1990  Gabaldon et al. .............. 364/132 X
5,097,437  3/1992  Larson ........................... 395/500 X Primary Examiner—Robert L. Richardson
Attorney, Agent, or Firm—Townsend and Townsend

[57] ABSTRACT

An apparatus and method for operating a system component in a microprocessor system. The component is operated by a component controller which runs off a clock having a frequency different than the system clock. The controller is synchronized with the system clock at the conclusion of a component access cycle. The state machine of the controller can thus operate independently of the system clock and timing options implemented by the controller need not have an even number of states.

11 Claims, 10 Drawing Sheets

NON-ALIGNED DRAM STATE MACHINE FOR PAGE-MODE DRAM CONTROL

BACKGROUND OF THE INVENTION

This invention relates to state machines and in particular to state machines for use in DRAM controllers.

Original equipment manufacturers often design system components with many options to differentiate their products from other products made with the same chip set. Briefly summarized, options are the ability to support in an optimized fashion alternate cycle types or operating speeds. Each option requires that the component controller execute a unique series of states to generate the timing signals required to implement that option.

Figure 1:
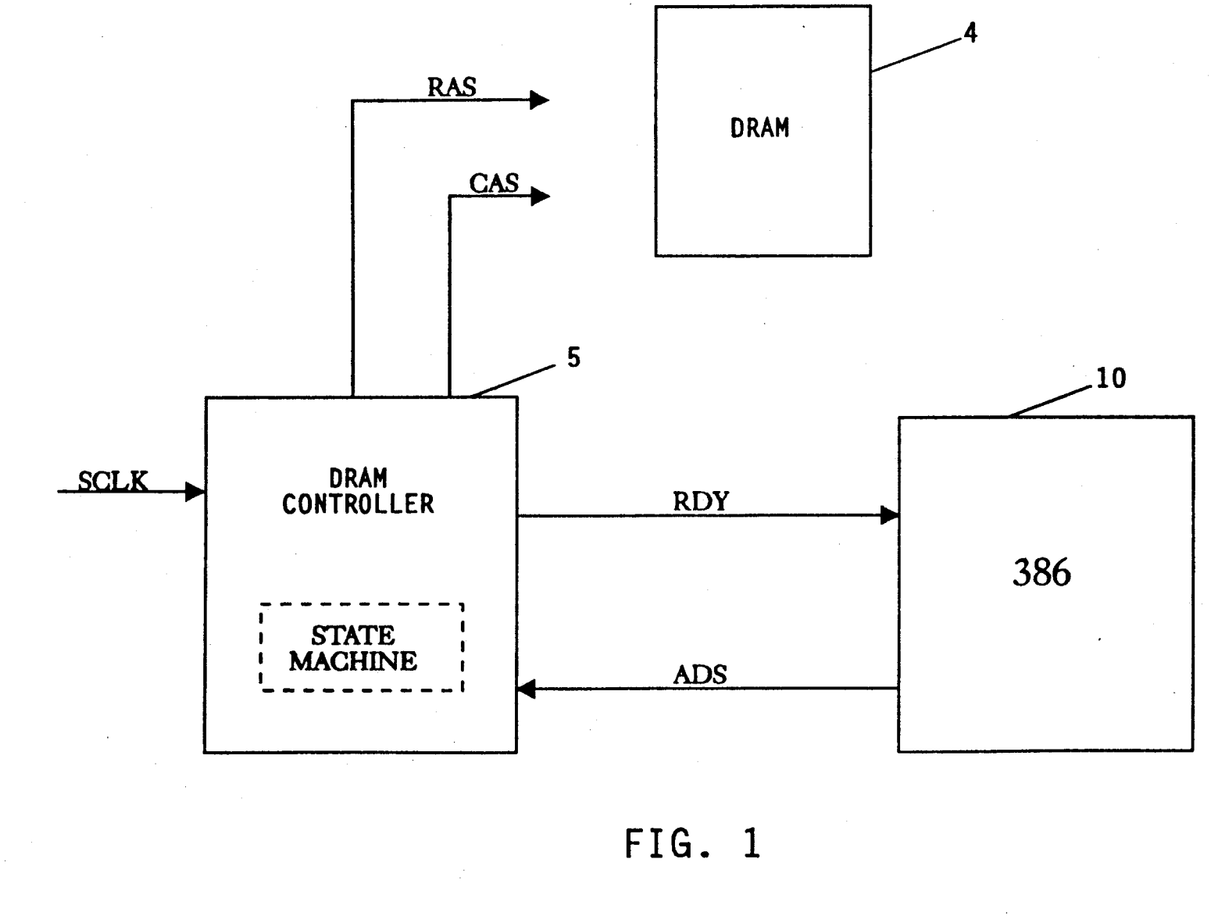
FIG. 1 is a block diagram of a system architecture having a DRAM, a microprocessor and a DRAM controller.

The practice of adding options to customize a device is particularly evident in the design of dynamic random access memory (DRAM) controllers. FIG. 1 shows a typical system architecture having a microprocessor 10, a DRAM 4 and a DRAM controller 5. Microprocessor 10 asserts an address request signal to controller 5 to begin a memory access. A state machine within controller 5 then transitions through the states necessary to issue the appropriate timing signals to DRAM 4 to perform the memory access. When DRAM 4 completes the memory access, controller 5 asserts a ready signal to microprocessor 10. Microprocessor 10 samples the ready signal on a given edge of the system clock and when the ready signal is detected reads the data retrieved from DRAM 4.

Memory access can occur using many different types of cycles such as page hit, page miss, RAS/CAS and RAS high. These cycles are diagrammed in FIG. 2. Memory access begins with the row address strobe (RAS) 11 going low to activate the memory row line, followed by the column address strobe (CAS) going low to activate a particular column within that row. The memory access cycle ends when CAS goes high. In the page hit cycle, the row address is assumed to be the same as the previous row address and there is no need to reassert RAS in this cycle type.

Figure 2:
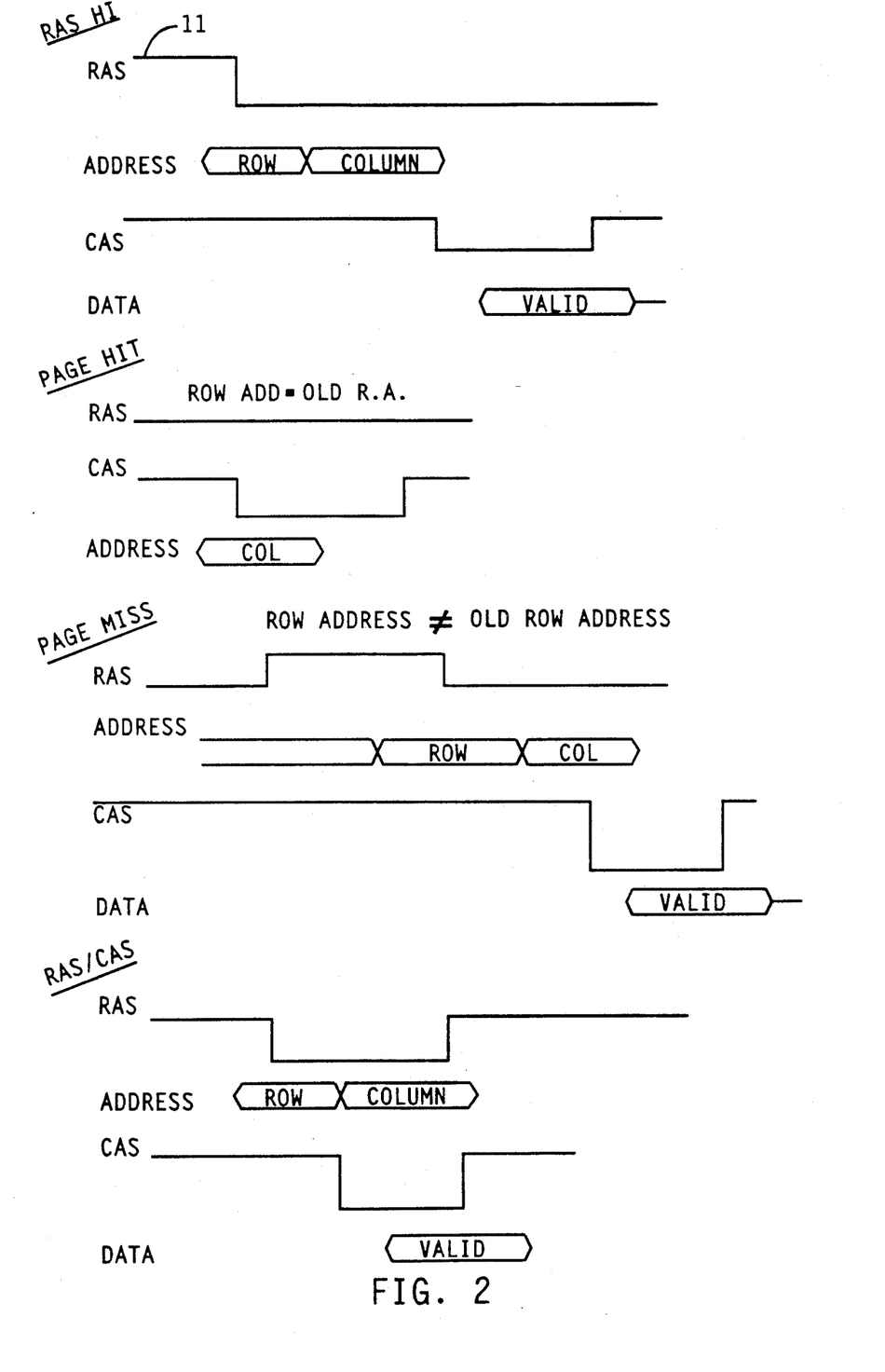
FIG. 2 is a set of timing diagrams illustrating different DRAM memory cycles.

As can be seen from FIG. 2 each memory cycle type requires a different amount of time for completion. Ideally, each one of the memory access cycle types is individually optimized to provide the maximum operating speed for all cycles. For optimization of each cycle type to occur, the controller state machine must issue the strobe timing signals at different periods of time for each cycle. The state machine of the DRAM controller must thus transition through a different sequence of states to implement each cycle type.

In addition to the many memory access cycle types, DRAMs have many different operating speeds. Two common DRAM operating speeds are 80 and 100 nanoseconds. Within each different speed class, individual DRAM manufacturers specify their own unique timing parameters for each type of cycle. For example, the timing parameters of manufacturer A may require that a page hit cycle CAS be five clock cycles in duration, while the timing parameters of manufacturer B require CAS be six clock cycles in duration. Thus, there exists a plethora of DRAM optimization parameters which can be included as various timing options. One set of timing options is needed on the controller chip just to support multiple cycle types. Another set of timing options must be included, if the DRAM controller is designed to support more than one manufacturer's DRAM.

Typical chip set designs employ DRAM state machines having many states to allow for all the options. Because the microprocessor samples the ready signal on a given edge of the system clock, the states in the state machine must be explicitly synchronized, or aligned with, the correct phase of the system clock, SCLK. Therefore, options must insert an even number of states in the state machine to ensure that the state machine is aligned with SCLK at the completion of the memory cycle. Ensuring an even number of states often requires the addition of unnecessary idle states. Optionally, systems designers can refrain from combining options in such a way that an odd number of states occur. In this way, certain combinations of options become illegal.

The sheer number of options and the restrictions on implementing them, make controller state machine design complex and difficult. The need to insert idle states to ensure an even number of states greatly increases the number of states which must be incorporated into the controller state machine. In addition, options may be inadvertently combined in an illegal manner unbeknownst to the system user. These two facts complicate the debugging process, increase controller chip costs and delay delivery of new systems to the market place.

SUMMARY OF THE INVENTION

The state machine of the present invention recognizes that although memory accesses must begin and end in phase with SCLK, the states in the middle of the state machine do not need to bear any relationship to the phase of SCLK. Thus, a number of states (even or odd) can be inserted in the middle of the state machine. The total number of states inserted are the sum of those appropriate for implementing the desired options. The state machine is synchronized with the system clock at the conclusion of the device access cycle. Synchronization can occur by sampling the states adjacent to the concluding state of the cycle and asserting a ready signal to the system microprocessor, when a given edge of the system clock is detected, such that this signal is present at the conclusion of the access cycle.

According to one aspect of the present invention, a controller device has a means for storing a given set of component timing options; a state machine for transitioning through a series of states to output a plurality of timing signals to said system component and coupled to said means for storing and to a second clock having a frequency different from said first clock; and means for synchronizing said state machine to said first clock when said state machine has completed said series of state transitions.

According to another aspect of the present invention, a method for operating a system component comprises the steps of storing a given set of component timing options; transitioning through a series of states using a state machine to output a plurality of timing signals to said system component according to said given set of timing options; operating said state machine using a second clock having a frequency different from said first clock; and synchronizing said state machine to said first clock when said state machine has completed said series of state transitions.

DESCRIPTION OF THE PREFERRED EMBODIMENT

Figure 3:
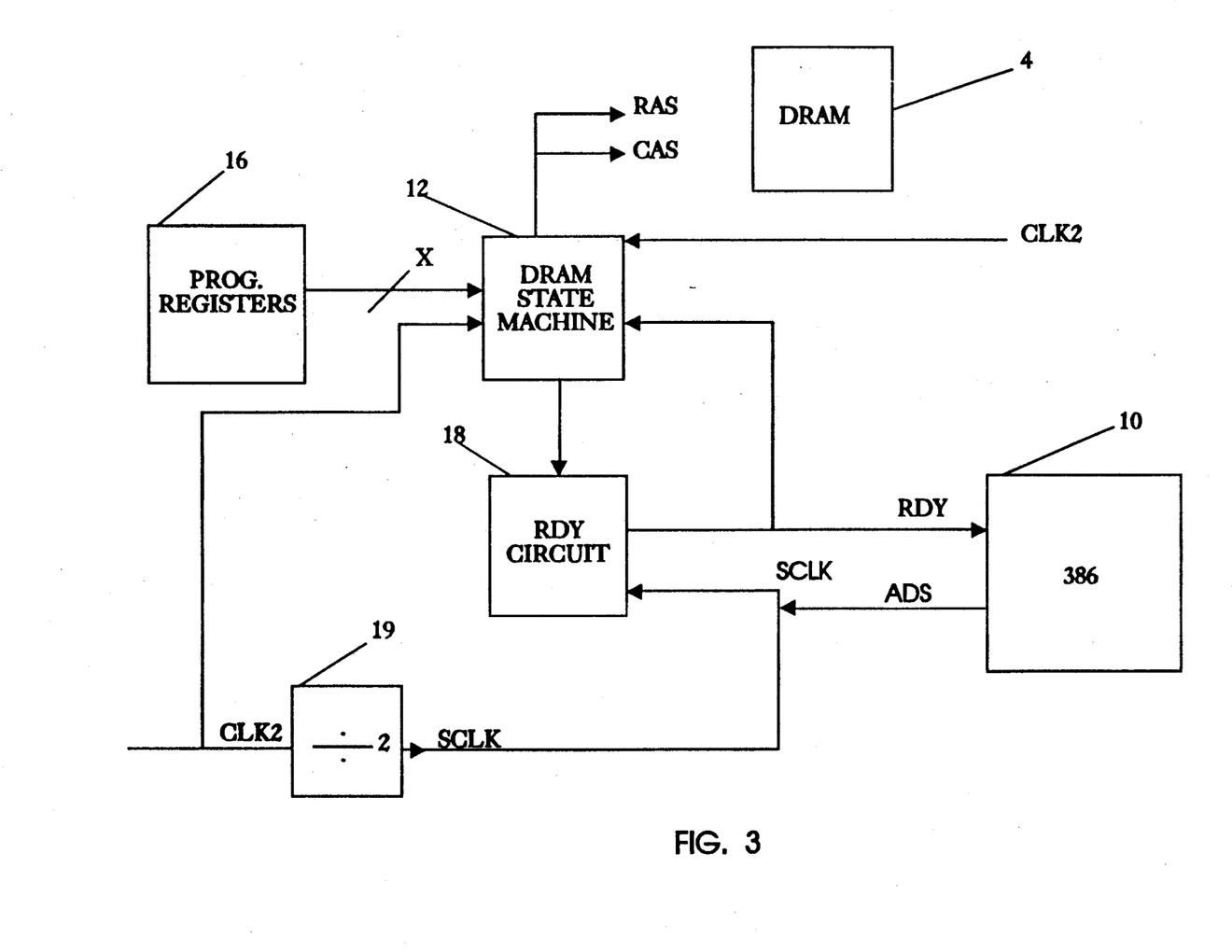
FIG. 3 is a block diagram of a state machine architecture according to an embodiment of the present invention.

FIG. 3 shows a top level block diagram of a state machine architecture according to an embodiment of the present invention. State machine 12 outputs timing signals to DRAM 4 to implement memory access cycles according to the DRAM operating speed and type of cycle desired. The speed and cycle options which can be implemented by the state machine are programmed into programmable registers 16. State machine 12 also contains ready circuitry 18 for asserting the ready signal when DRAM 4 completes a memory access. CPU 10 then responds by reading data from DRAM 4.

State machine 12 operates according to clock input CLK2 which has a frequency of two times the system clock frequency (SCLK). Clock signal CLK2 is generated by circuitry (not shown) elsewhere in the system according to hardware known to those of ordinary skill in the art. Clock divide logic 19, also well known to those of skill in the art is used to generate one clock signal when given the other. State machine 2 may operate using other multiples of the system clock or other clocks and the invention is not limited to a multiple of two of the system clock.

Because state machine 12 operates on a clock of a different frequency than the system clock, state machine 12 can operate independently of the system clock. Once the states necessary to execute a particular option, or set of options, are completed, the state machine can then be synchronized with the system clock. Synchronization can occur by timing the output of the ready signal to be aligned with the system clock once the state machine has transitioned through the desired states. Alternatively, synchronization can occur directly from the system clock. Thus, there is no need to insert a requisite number of states for each option to align the state machine with the system clock.

The operation and general principles of the state machine of the present invention is best illustrated by way of example. For purposes of this example, CPU 10 samples the ready signal on the rising edge of SCLK and there exists a requirement that the CAS pulse width be at least five CLK2 cycles in duration. According to the present invention, the desired CAS width can be selected from one of several options by programming programmable registers 16.

Figure 4:
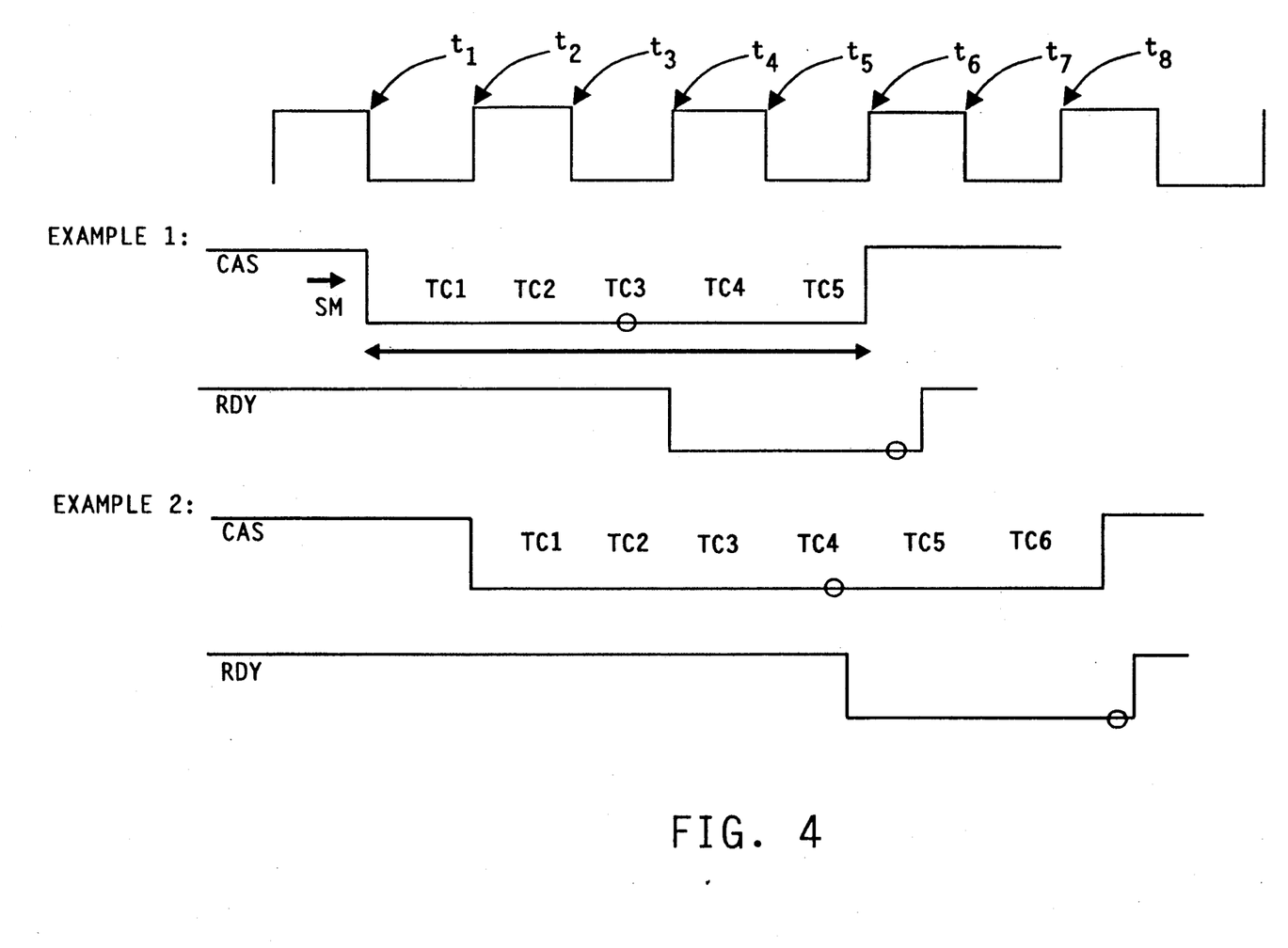
FIG. 4 is a timing diagram useful for illustrating operation of the present invention.

FIG. 4 contains timing diagrams for CAS of a page miss cycle constructed according to the example paramters. In example 1 of FIG. 4, the CAS pulse width is selected to be five CLK2 cycles and begins at time t1, on the falling edge of an SCLK pulse. The state machine transitions through states TC1-TC5 as shown to generate a CAS pulse of the desired length. Ready circuitry 18 samples the states on the rising edge of SCLK. When one of the two states adjacent to the programmed completion of the CAS pulse occurs, ready circuitry 18 detects this state and asserts the ready signal. The two states which are adjacent to the completion of the CAS pulse are known from the state machine equations that govern operation of the controller state machine. The limited number of states which occur adjacent to the completion of a particular memory cycle are known and are included as part of the ready circuit logic.

In example 1 of FIG. 4, ready circuitry 18 samples the states on the rising SCLK edges t2, t4. During time t2, state TC1 is detected. However, this state is not one of two states adjacent to the final state of this cycle and is thus not used by the ready circuit logic to assert a ready signal. At time t4, ready circuit 18 detects state TC3. This state is a state which occurs adjacent to the completion state of the page miss read cycle of example 1. When ready circuitry 18 detects this state at time t4, the circuit asserts a ready signal of two CLK2 pulse widths. When CPU 10 samples the ready signal on the next rising edge of SCLK, CPU 10 will detect the ready signal and read the data retrieved from DRAM 4. Note that in example 1 of FIG. 4 the total number of states is odd.

In example 2 of FIG. 4, the CAS pulse width is also selected to be five CLK2 pulse widths, however, in this example the CAS pulse does not begin until time t2. Thus, five CLK2 pulse widths later, the state machine is not aligned with the rising edge of SCLK. Also, in this example, unlike in example 1, when ready circuitry 18 samples the state machine at time t4, state TC3 or TC4 are not detected. Ready circuitry 18 next samples the state machine at time t6 and detects state TC4. Since TC4 is one of the states which occurs adjacent to the conclusion of a page miss read cycle, ready circuit 18 asserts the ready signal at this time. However, CPU 10 will not sample the ready and terminate the memory access cycle until time t8, on the next rising edge of SCLK. The CAS pulse must remain asserted until the end of the memory cycle. Under these conditions, a state TC6 is inserted by the state machine to keep the CAS pulse asserted until time t8.

Figure 5:
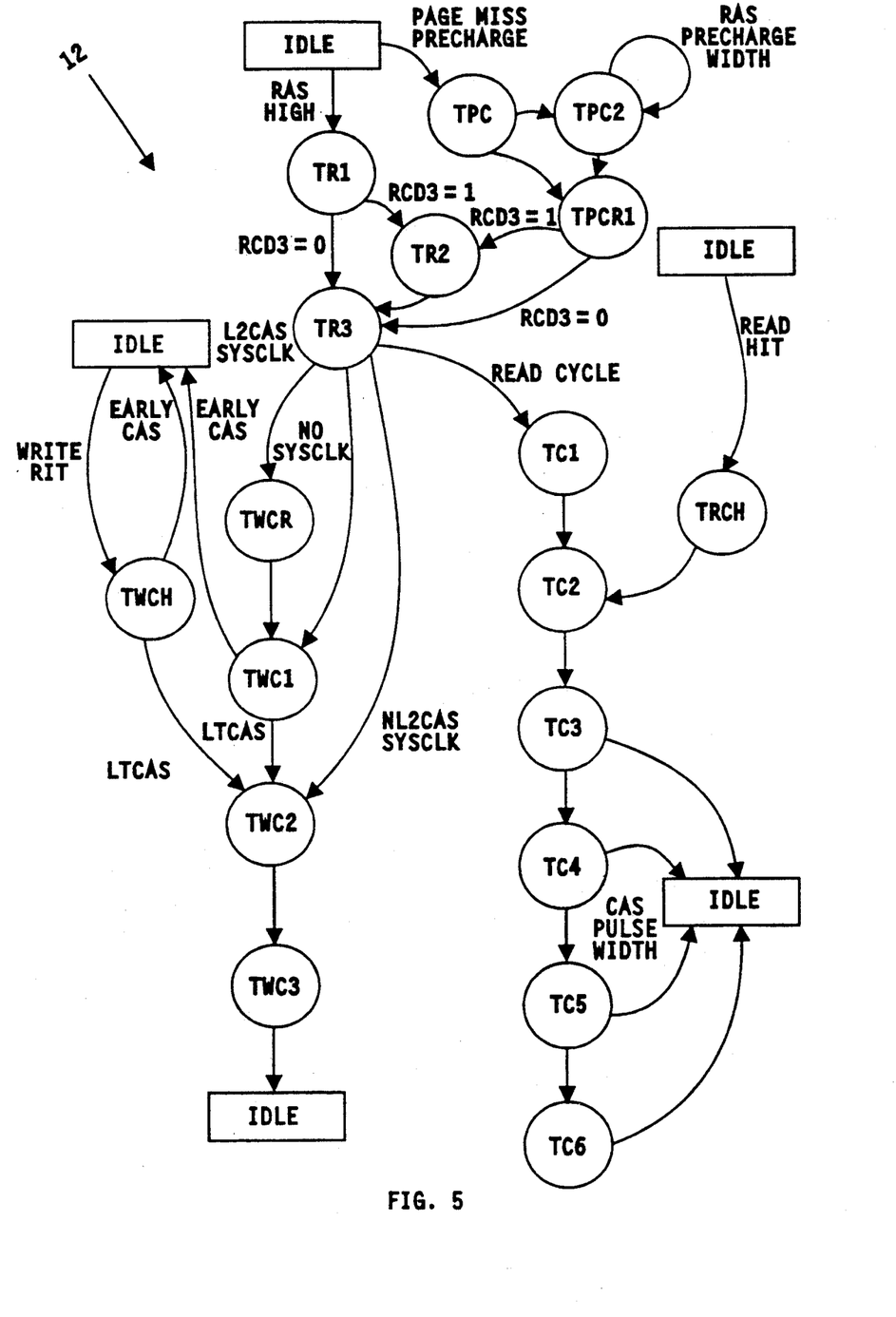
FIG. 5 is a state machine state transition diagram according to an embodiment of the present invention.

Now that the structure and operation of the present invention has been explained in general terms, a more detailed description of a specific embodiment of the invention may be undertaken. FIG. 5 shows an example of a specific DRAM controller state machine according to an embodiment of the present invention. State machine 12 may be implemented as a programmable logic array. The state machine of FIG. 5 is capable of implementing the options described in Table 1. Those options desired by the system designer are selected by writing specified values into the programmable registers associated with and coupled to the state machine. Transitions between states are logical functions of these parameter values and occur according to the equations given in Table 2. The state machine of FIG. 5 requires only 23 states to implement these options. Conventional state machines not incorporating the present invention require many more states to implement the same number of options.

Figure 6A:
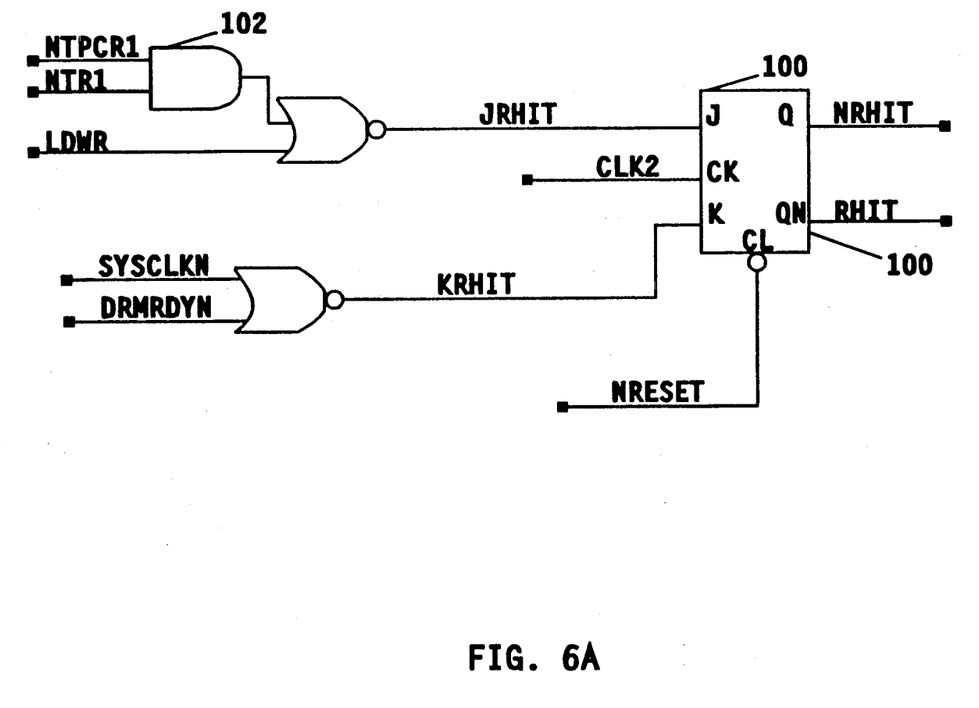
FIG. 6A and 6B are a logic diagram of a ready circuit according to an embodiment of the present invention.
Figure 6B:
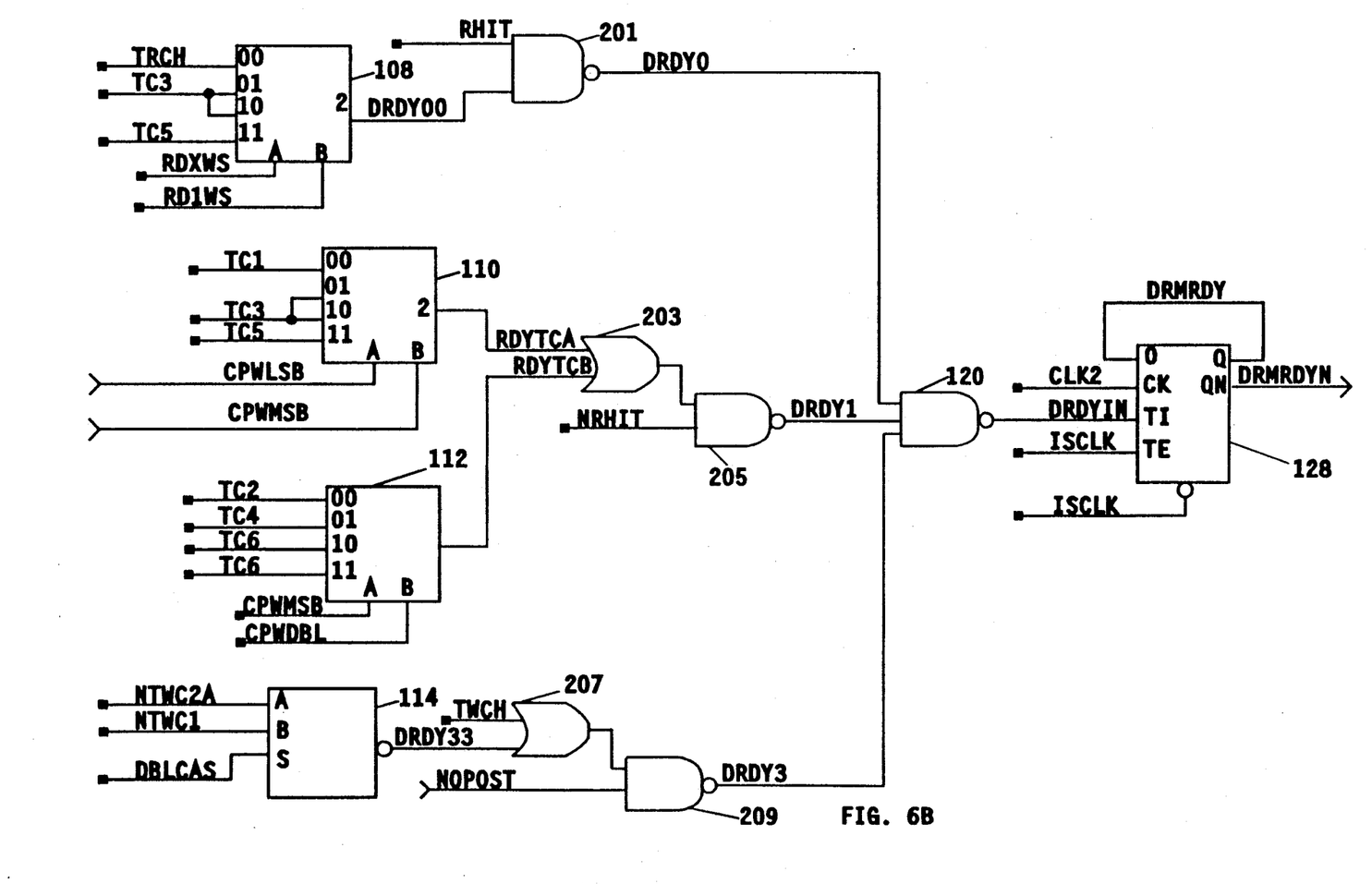

FIGS. 6A and 6B show an example of a ready circuit 18 which may be used with the example state machine of FIG. 5 to synchronize the state machine with the system clock. In the portion of ready circuit 18 diagrammed in FIG. 6A, a flip flop 100 outputs a signal which indicates the presence or absence of a page hit, also known as a read hit cycle. From the state machine diagrammed in FIG. 5, states TRCR1 and TR1 do not occur in a page hit cycle and if asserted, indicate a cycle type other than a page hit. Thus these signals are input to a NAND gate 102 and then NORed with signal LDWR [latched write] to form the J input of flip flop 100. The K input of flip flop 100 is the NOR of the system clock and DRM ready signals. The Q output of flip flop 100 indicates a non-page hit read cycle, while the $\overline{Q}$ output indicates a page hit read cycle.

FIG. 6B contains three 4×1 multiplexers: 108, 110 and 112; and one 2×1 multiplexer 114. Multiplexer 108 has two select inputs RDXWS and RD1WS. These variables are two of the programmable options listed in Table 1 and indicate how many wait states are added to a page hit read cycle. Depending on the value of these variables, either state TRCH, TC3 or TC5 will be one of the two states adjacent to the final state in a page hit read cycle implemented by the state machine of FIG. 5. Thus when this particular state occurs, this signal is selected by the multiplexer to be propagated to the output and NANDed with the variable indicating a page hit read cycle.

Multiplexers 110 and 112 detect those states which occur prior to the conclusion of read cycles which are not page hit cycles. The select inputs of multiplexer 110 are the most and least significant bits of the CAS pulse width. The select inputs of multiplexer 112 are the most significant bit of the CAS pulse width variable and the variable CPWDBL. Variable CPWDBL is also listed in Table 1 and is a global variable that sets the CAS pulse width at seven CLCK2 cycles. CPWDBL can be asserted only when the most and least significant bit of CPW is a one.

Multiplexer 114 detects those two states which occur adjacent to the final state in a write cycle. The select input of multiplexer 114 is the programmable option variable DBLCAS. The variable DBLCAS indicates that the CAS pulse width has been doubled. See Table 1. The outputs of multiplexers 108-114 are processed by combinational logic as shown in FIG. 6B and input via NAND gate 120 to flip flop 128.

Figure 7:
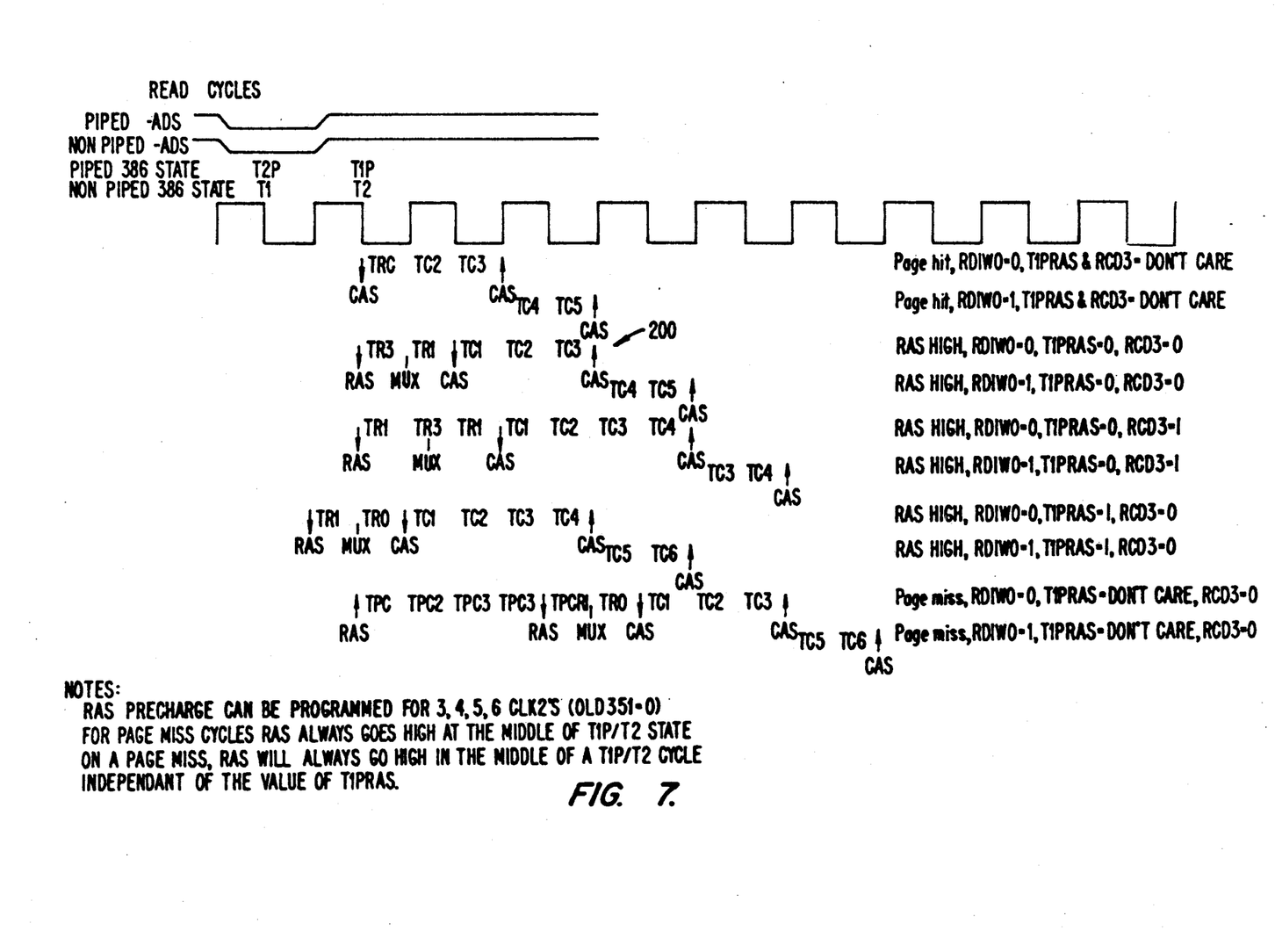
FIG. 7 is a set of timing diagrams showing examples of read cycles as implemented by the state machine of FIG. 5 according to an embodiment of the present invention.
Figure 8:
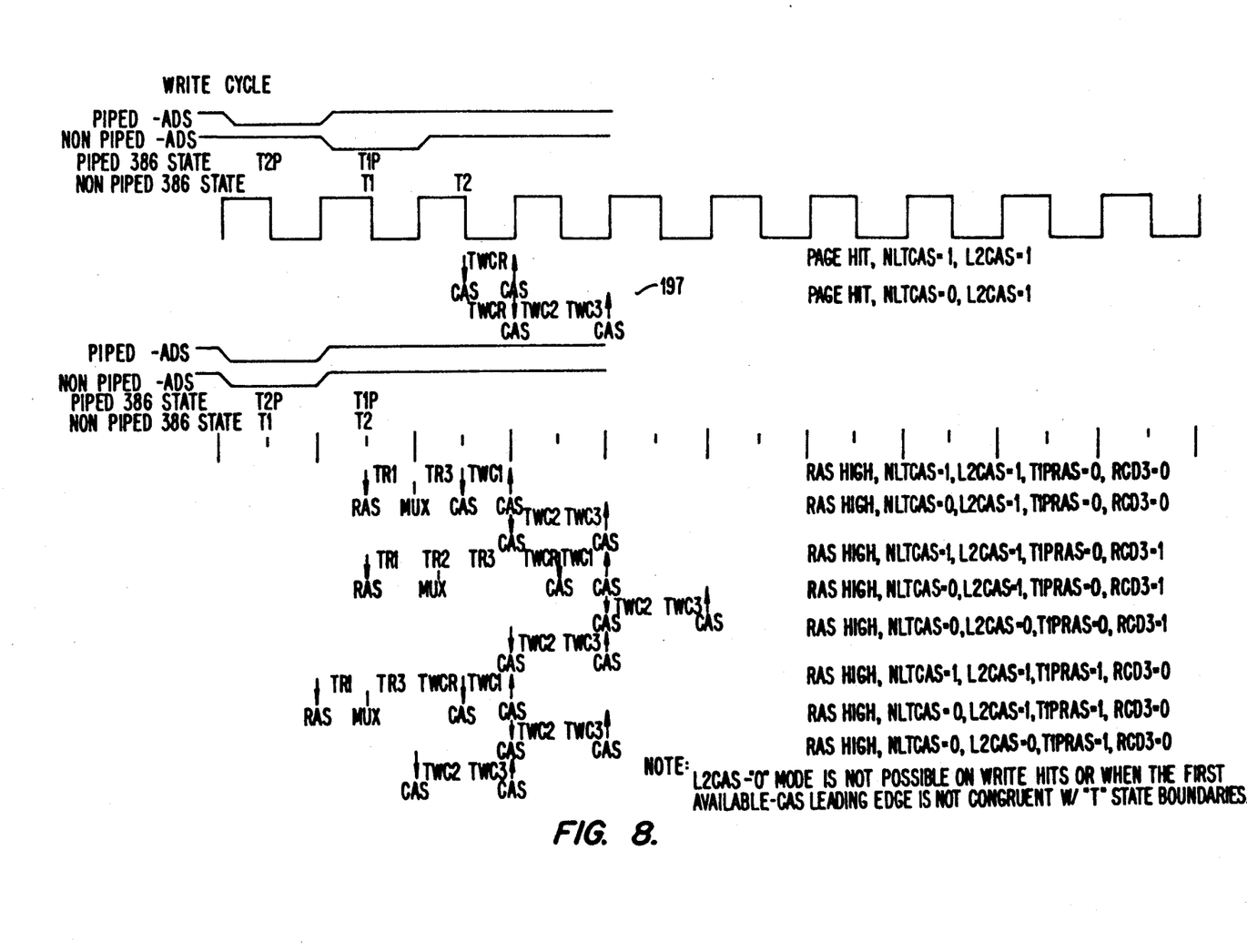
FIG. 8 is a set of timing diagrams showing examples of write cycles as implemented by the state machine of FIG. 5 according to an embodiment of the present invention.
Figure 9:
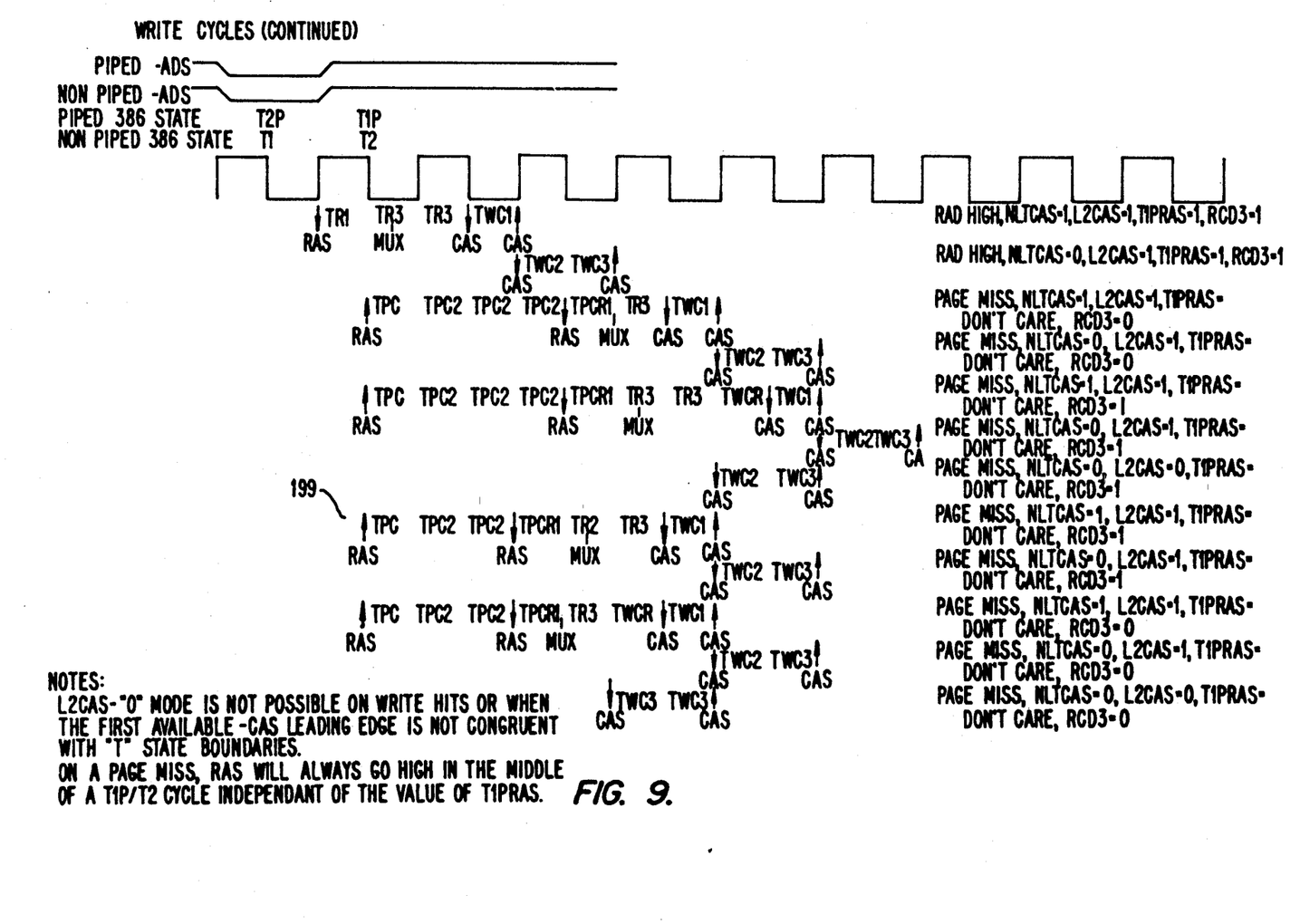
FIG. 9 is another set of timing diagrams showing examples of write cycles as implemented by the state machine of FIG. 5 according to an embodiment of the present invention.

The operation of the present invention as embodied in FIGS. 5 and 6 is best illustrated with some specific examples. FIGS. 7-9 contain timing diagrams of read and write cycles and associated state transitions for various combinations of programmable options. For example, FIG. 8, line 197 diagrams a page hit write cycle while FIG. 9, line 199 diagrams a page miss write cycle. FIG. 7 reference number 200 diagrams the timing signals and state transitions produced for a rashi read cycle in which the system designer has specified the CAS pulse width to be three CLK2s. The variables CPWMSB and CPWLSB (called CPW1X and CPW0X in Table 1) are both zero. The variable RD1WS has therefore been written into the programmable register 16 as 0.

In example line 200, state machine 12 of FIG. 5 transitions through the states indicated in FIG. 5 according to the equations given in Table 2 and the value of the variables contained in the programmable register. The state transitions are: TR1, TR3, TC1, TC2, and TC3. This rashi cycle therefore ends with state TC3 and the two states immediately preceding this final state are TC2 and TC1.

In the circuit of FIG. 6B, the select of multiplexer 108 is set to zero, zero because RD1WS has been set to zero in programmable register 16. The circuit of FIG. 6A detects that states TPCR1 and TR1 are asserted which causes the $\overline{Q}$ output, signal RHIT, of flip flop 100 to be deasserted. Thus, the output of NAND gate 201, signal DRDY0, is asserted.

The CAS pulse width on line 200 of FIG. 7 is three CLK2 cycles in duration. The variable CPW is a two bit number and therefore the most significant bit of CPW in this instance is 0 and the least significant bit is 0. Thus, when state TC1 is active, this signal is propagated to the output of multiplexer 110 and input to OR gate 203. When RDYTCA is asserted, the output of gate 203 is asserted and NANDed with signal NRHIT which is asserted. Thus, the signal DRDY1 is deasserted whenever state TC1 is active.

Multiplexer 112 select inputs are set at 0,0. Therefore, when state TC2 is active, this signal is propagated to the output of multiplexer 112 and input to OR gate 203. In summary, when state TC2 is asserted, the output of OR gate 203 is asserted. This signal is input to NAND gate 205. Signal NRHIT is asserted since the current cycle is not a page hit cycle. The signal DRDY1 output from NAND gate 205 is therefore deasserted whenever state TC2 is active.

Multiplexer 114 does not propagate any signal to OR gate 207 since states TWC2A and TWC2B occur only in write cycles. Similarly, signal TWCH can only occur during a write cycle and the output of gate 207 is deasserted during the memory access cycle of this example. Signal NOPOST input to NAND gate 209 indicates the presence or absence of posted write cycles and is not asserted for this particular example. The output of gate 209 is therefore asserted during the cycle of this example.

During states TC1 and TC2 therefore, NAND gate 120 propagates a signal DRDYN to flip flop 128. On the rising edge of SCLK, the ready signal will be latched to the output of flip flop 128. From line 200 of FIG. 7, when signal DRDYN first becomes active during state TC1, the rising edge of SCLK is present. Therefore, the ready signal will be latched by flip flop 128. During the next state TC2, the rising edge of the SCLK is not present and the ready signal is already latched to the output of flip flop 128. Because of the construction of flip flop 128, the ready signal will be output for two cycles of CLK2 and will therefore be asserted during the final state of the cycle. Thus, when CPU 10 samples the ready signal on the final state of the cycle, the ready signal will be detected and the memory access cycle will end.

Note that the number of cycles in the present example is odd and that the state machine of the present invention began the cycle in the middle of the SCLK pulse. Furthermore, no extra states were added by the state machine of the present invention to synchronize the operations with the CPU. The state machine of the present invention can therefore operate independently of the system clock and there is no requirement to insert a specific number of states to keep phase with this clock. Rather, the state machine of the present invention synchronizes itself with the system clock at the conclusion of the current access cycle by asserting a ready signal which is present on the desired edge of SCLK when the access cycle concludes. The state machine thus does not need to insert unneeded states to ensure synchronization with the CPU and state machine design and debugging is reduced in complexity. In addition, any numbers of combinations of options may be specified by system designers without worrying about whether the particular combination will result in an unsynchronized state machine.

Preferred embodiments of the present invention have now been described. Variations and modifications will be readily apparent to those of ordinary skill in the art. For this reason, the invention should be construed in light of the claims.

TABLE 1

| PROGRAMMABLE OPTION BITS | |
|---|---|
| NLTCAS (Not late CAS) | This programmable option affects the timing of DRAM write cycles only. It does not change the timing of a hit, RAS high, or miss rad cycle, but will affect the number of waitstates that the following cycle (hit, miss, or RAS high read cycle following a write page cycle) takes to complete. If back to back write page cycles are occurring, then the controller will be able to perform 0 wait state writes continuously regardless of the setting ("0" or "1") of the NLTCAS bit. The advantage of this programmable option is that when it is programmed as a "1" and a page write cycle is followed by a page hit or miss read cycle, the following read will be performed with one less wait states (page hits can be performed in 0 waits) than if NLTCAS is programmed as a "0". When NLTCAS is programmed as a "1", the CAS pulse width (for write cycles) is 1 CLK2 period (20 ns for a 25 Mhz 386) and the CAS precharge is 1 CLK2 (20 ns). These aggressive numbers necessitate the use of fast (tRAC < 60 ns) DRAMS. Programmable interdependencies. When NLTCAS = "1" (early CAS write), ERELMA has no affect on release of MA lines and is a don't care. (ERELMA = "X"). L2CAS must be programmed as a "1", therefore the combination NLTCAS = "1", L2CAS, = "0", is an illegal condition and must not be used. When NLTCAS = "0", if L2CAS = "1", one additional SYSCLK will be added to the write cycle time and the CAS pulse will be 2 CLK2s wide. If L2CAS = "0", no additional SYSCLK time will be added, but the CAS pulse width will be 2 CLK2s wide. When DBLCAS = "1", NLTCAS must be set to a "0"; however L2CAS may be programmed as a "0" or "1". If the cycle is a write page cycle, the CAS pulse width will be 4 CLK2s and will introduce 2 additional SYSCLKs (from early CAS timings, MPC) to the write cycle time. If the cycle is a write miss or RAS high cycle; then if L2CAS = "1", the CAS pulse width will be 4 CLK2s and will introduce 2 additional SYSCLKs of time to the write cycle; otherwise, if L2CAS = "0", 4 CLK2s wide and 1 additional SYSCLK of time. (Note, L2CAS = "0" may introduce 2 additional SYSCLKs when programming is not congruent with the possibility of generating L2CAS = "0" cycles). |
| CASENMD (CASE enable mode) | When this bit is set to a "1", the odd RAS lines (1,3,5,7) will take on the function of CASEN. (CASEN<A,B,C,D>, CAS enable pins). CASENMD must be programmed to a "1" when the user is interleaving banks of memory (A & B, or C & D, or A & B & C & D). This bit is global for all banks of memory, and when set, the CAS lines for each bank (A,B,C,D) must be qualified by the appropriate CASEN signal. When CASENMD = "0" no memory interleaving, RAS lines 0,1,2,3,4,5,6,7 support 8 banks of memory. |
| ERELMA (early release of MA write address) | This programmable option is used to increase the address hold time to CAS (tCAH) for all DRAM cycles. In general, it will be programmed to a "0" (late release) if slow DRAMs (>60 ns) or higher operating frequencies (>25 Mhz) are being used. This is necessary because with ERELMA = "1" the address data is held for 1 CLK2 (20 ns, using 25 Mhz.), which does not give enough system margin (for tCAH) using slower DRAMs or higher frequencies. When programmed to a "0" the CAS address hold will be equal to 2 CLK2's. Programmable interdependencies. When NLTCAS = "1" (early CAS write, MPC mode), ERELMA is a don't care condition. (ERELMA = "X"; the cycle however, will behave as if ERELMA is programmed as a "1".). When ERELMA = "0" (late MA release), one of the bits ADDBRW (Reg 19, bit 3) or ADDBACK (Reg 2F, bit 4) should be set to a "1" to add a wait state between cycles. If ADDBRW = "1", then a wait state is added between cycles except back to back write page cycles. Note, this enables page write cycles to run 0 wait states even though programmed NLTCAS = "0", ERELMA = "0" (late CAS write, late MA release; this implies that a system using slower than 60 ns DRAMs and/or faster than 25 Mhz can still run 0 wait state page writes, while reads or mixed read/write cycles will add 1 wait state for page cycles.). When ADDBACK = "1", 1 wait state will be added to all cycles. When ERELMA = "0", an alternative to setting the ADDBACK or ADDBRW to a "1" is to set the DBLCAS bit to a "1". (ADDBRW = ADDBACK = "0"). The MA lines will release 2 CLK2s before the rising edge of CAS allowing the internal circuitry enough time to decode the next cycle. (Some of the decoding is initiated from the release of the MA lines). However, be cautioned that with this solution, if the following cycle is a page read hit cycle (following a page write cycle) that the CAS precharge width will be only 1 CLK2 wide. (Possibly not enough for some applications with slow DRAMs or higher frequencies.) In general, when NLTCAS is programmed as a "0" (late CAS write), ERELMA should be programmed with a "0". |
| ADDBRW (Add 1 wait state to all page cycles except back to back write page cycles) | This programmable option is used to add 1 wait state between all cycles except back to back writes that are page cycles. This option will be used, (ADDBRW = "1") in general, at higher frequencies (>25 Mhz.) or when using slower (>60 ns) DRAMs. One purpose of this programmable option is to increase the CAS precharge time (tCP) [from 1 CLK2 to 3 CLK2s (read page hit following a write page cycle), or 1 CLK2 to 2 CLK2s (write page cycle following a write page cycle)] which is necessary when running page mode cycles at higher frequencies and/or slower DRAMs. Another reason for this option (ADDBRW = "1") is to give more time for the controller internal logic to decode (make a hit/miss decision) the next cycle. This is especially true when a late CAS page write cycle (NLTCAS = "0"), with late release of MA lines (ERELMA = "0"), is followed by a page read hit. In this case, ADDBRW can be programmed to a "1" to allow extra time for the next cycle decode. (Some of the cycle decode is |

TABLE 1-continued
PROGRAMMABLE OPTION BITS

| | |
|---|---|
| | initiated by the release of the MA lines, which are released late in this scenario.) |
| | Programmable interdependencies. |
| | When ADDBRW = "0" and ADDBACK = "0", (don't add wait states), NLTCAS and ERELMA will most likely be programmed to a "1". (MPC mode). When ADDBRW = "1" (add wait state), ERELMA can be programmed as a "0" to achieve 0 wait state DRAM write cycles at higher frequencies and/or with slower DRAMS. When ERELMA = "0" (release MA lines late), one of the bits ADDBRW (Reg 19, bit 3) or ADDBACK (Reg 2F, bit 4) should be set to a "1" to add a wait state between cycles. If ADDBRW = "1" then a wait state is added between cycles except back to back write cycles. Note, this enables page hit write cycles to run 0 wait states even though programmed NLTCAS = "0", ERELMA = "0". (late CAS write, late MA release; this implies that a system using slower than 60 ns DRAMs and/or faster than 25 Mhz can still run 0 wait state page hit writes, while reads or mixed cycles will add 1 wait state for these cycles.) When ADDBACK = "1", 1 wait state will be added to all back to back cycles. When ERELMA = "0", an alternative to setting the ADDBACK or ADDBRW to a "1" is to set the DBLCAS bit to a "1". (ADDBRW = ADDBACK = "0"). The MA lines will release 2 CLK2s before the rising edge of CAS allowing the internal circuitry enough time to decode the next cycle. (some of the decoding is initiated from the release of the MA lines). However, be cautioned that with this solution, if the following cycle is a page read hit cycle (following a page write cycle) that the CAS precharge width will be only 1 CLK2 wide. (possibly not enough for some applications with slow DRAMs or higher frequencies). The KF factor for the controller is reduced when ADDBRW is programmed as a "1". The user should expect some product "fallout" when ADDBRW = "1". An alternative is to use the full ADDBACK = "1", which adds waitstates to all back to back cycles (reducing performance), but has no KF factor penalty. |
| ELBEN (Generate LDBEN and DWE early) | This programmable option is used to adjust the timing of the LDBEN and DWE signals. It is used to add extra DWE active to CAS active margin (tWCS) for higher operating frequencies. (>25 Mhz.). It also generates needed margins (tCWS and earlier LDBEN) for early CAS write mode. (using NLTCAS = "1", MPC mode.) For pipelined cycles, ELBEN has no effect (ELBEN = "X") on the timing of LDBEN and DWE. Both signals will have identical timings (for both early CAS (NLTCAS = "1") and late CAS (NLTCAS = "0") and will go active (low) in the middle of the "T" state following the ADS signal active. Both signals will go inactive (high) with the rising edge of CAS. For nonpipelined cycles, when NLTCAS = "1" (early CAS), ELBEN has no effect (ELBEN = "X") LDBEN and DWE will go active 1 CLK2 before CAS goes active and will go inactive with the rising edge of CAS. When NLTCAS = "0" (late CAS) and ELBEN = "1", LDBEN and DWE will go active 2 CLK2s before CAS goes active and inactive with the rising edge of CAS. When NLTCAS = "0" and ELBEN = "0", LDBEN will go active 2 CLK2s minus 5 ns before CAS goes active; DWE will go active 1 CLK2 before CAS goes active. Both signals go inactive with the rising edge of CAS. ELBEN = "0" is useful for slower operating frequencies. Programmable interdependencies. When NLTCAS = "1" (early CAS write, MPC mode), ERELMA is a don't care condition. (ERELMA = "X", the cycle however, will behave as if ERELMA is programmed as a "1".). |
| RASCTST0 & RASCTST2 (RAS page compare test modes) | Inside the controller there are four page compare registers (1 for each block of memory) that are used to hold the present value of page of DRAM being addressed for that particular block. In order to efficiently test the integrity of the compare logic and registers for various page values, the controller incorporates a page hit test mode that does not require the DRAM controller to operate. This results in a mechanism that can verify the logic through numerous and varied combinations in an efficient manner. In addition, the hit/miss indication is brought out on an external pin for fast verification. The test mode is invoked by programming RASCTST0 "1", DBLCAS = "0", and RASCTST2 = "1". A page address (on the PA<31:2> lines) is then strobed into the 4 page compare registers by a low pulse on the M/IO pin. Each compare register may be selected with the accompanying byte enable (BE<3:0> pin. The PA<31:2> address lines are then compared with the block decode and page address, for a given block, and the resultant hit/miss indication is present on the parity enable (PEN) output signal. A low ("0") on the PEN signal indicates a page hit. |
| DBLCAS (Generate double CAS pulse width for DRAM writes) | This programmable option is specifically added for 40 Mhz (60 ns DRAM) operation, but can also be used with 33 Mhz (70, 80 ns DRAM) or 25 Mhz (100 ns DRAM) configurations. When DBLCAS = "1" and NLTCAS = "0" (late CAS), the CAS pulse for writes will be CLK2s. This improves CAS pulse width margins (tCAS) when using slower DRAM memories and/or operation at higher operating frequencies. Programmable interdependencies. When DBLCAS = "0" and NLTCAS = "0", the CAS pulse width will be 2 CLK2s. When NLTCAS = "1" (early CAS write), the bit DBLCAS must be programmed as a "0". The programmed condition NLTCAS = "1" (early CAS), DBLCAS = "1" (double CAS mode) is an illegal condition and must never be programmed. When DBLCAS = "1", NLTCAS must be set to a "0"; however L2CAS may be programmed as a "0" or "1". If the cycle is a write page cycle, the CAS pulse width will be 4 CLK2s and will introduce 2 additional SYSCLKs (from early CAS timings, MPC) to the write cycle time. If the cycle is a write miss or RAS high cycle; then if L2CAS = "1", the CAS pulse width will be 4 CLK2s and will introduce 2 additional SYSCLKs of time to the write cycle; otherwise, if L2CAS = "0", 4 CLK2s wide and 1 additional SYSCLK of time. (Note, L2CAS = "0" may introduce 2 additional SYSCLKs when programming is not congruent with the possibility of generating L2CAS = "0" cycles). |
| CPW0X, CPW1X X = A,B,C,D (CAS low pulse width for page miss, RAS high read cycles for blocks A,B,C,D) | These two programmable bits determine the CAS pulse width for page miss and RAS high read cycles. (Page read hit CAS pulse width is determined by other bits). The available settings are:<br><br>\| CPW1X \| CPW0X \| CAS pulse width (CLK2s) \|<br>\|---\|---\|---\|<br>\| 0 \| 0 \| 3 \|<br>\| 0 \| 1 \| 4 \|<br>\| 1 \| 0 \| 5 \|<br>\| 1 \| 1 \| 6 \|<br><br>The DRAM controller will automatically add an additional CLK2 time to the CAS pulse width if the combination of programmed RAS precharge, RAS high timing, mux timing, and CAS pulse width is not congruent with "T" state boundaries. Therefore, it is possible that the CAS pulse width will be wider than the programmed value by 1 CLK2 time due to the above-explained behavior. Programmable interdependencies. When CPWDBL = "1", All CPW0X, CPWLX bits for all banks must be set to "1". CPWDBL is a global bit that programs all banks for 7 CLK2s |

TABLE 1-continued
PROGRAMMABLE OPTION BITS

| | |
|---|---|
| | pulse width (8 CLK2s if not congruent) and requires all CPWXX bits = "1". |
| RD1WSX, X = A,B,C,D (Add 1 wait state to page hit read cycles for blocks A,B,C,D) | This programmable option will add 1 waitstate to a page hit read cycle for a given block of DRAM memory. For pipelined cycles (non-cache systems), if RD1WSX = "0", the access will be performed in 0 waitstates; if RD1WSX = "1", 1 wait state. For nonpipelined cycles (cached systems), if RD1WSX = "0", read page accesses will be performed in 1 wait state; if RD1WSX = "1", 2 waitstates. Each block of DRAMs can be individually programmed so that the system may be optimized with different speeds of DRAM memory installed.<br>Programmable interdependencies.<br>When RDXWS is programmed as a "1", an additional waitstate will be added to the value programmed by RD1WSX bit.<br>In summary:<br>If RDXWS = "0", and:<br>RD1WSX = "1", Add 1 wait state to piped (0 ws) and nonpiped (1 ws) read page hit cycles.<br>RD1WSX = "0", Piped page hit cycles performed in 0 waitstates, nonpiped in 1 waitstate. |
| RDXWS (Add an additional waitstate to all read page hits) | This programmable option was added specifically for 40 Mhz operation. It will give extra margins for CAS access times (tCAC) when running at 40 Mhz for read page hit cycles. It globally adds a waitstate to all blocks (A,B,C,D) of DRAMS. This means that if RD1WSX = "0" (0 ws pipelined, 1 ws nonpipelined) for a given block, by programming RDXWS = "1" the total number of waitstates will now be 1 ws pipelined, 2 ws nonpipelined. Similarly, for another DRAM block programmed with RD1WSX = "1" (1 ws pipelined, 2 ws nonpipelined) the total of waitstates would now be 2 ws pipelined, 3 ws nonpipelined.<br>Programmable interdependencies.<br>RDXWS adds (globally to all banks of DRAM) one waitstate for page read hits. RD1WSX (X = A,B,C,D) adds one waitstate to individual blocks of DRAM for page read hits. The total number of wait states for a given block will be the sum of the RDXWS and RD1WSX contributions. |
| CPWDBL (Make CAS pulse width 7 or 8 CLK2s for page miss or RAS high read cycles) | This programmable option was added specifically for 40 Mhz operation. It will give extra margins for RAS/CAS accesses (tRAC, tCAC) when running at 40 Mhz for page miss and RAS high read cycles. CPWDBL is a global signal, so the timing of RAS/CAS cycles for all blocks of DRAM (A,B,C,D) will be affected if CPWDBL is set to a "1". If the total time of the combination of RAS precharge, RAS high starting time (T1PRAS), mux switching (RCD3), and programmed CAS pulse width (CPWDBL = "1") is congruent with "T" state boundaries, then the CAS pulse will be 7 CLK2s; otherwise the DRAM controller will add an additional CLK2 making the CAS pulse width equal to 8 CLK2s and congruent to "T" states.<br>Programmable interdependencies.<br>When CPWDBL = "1", all CPWXX bits (CPW00, CPW10, CPW01, etc.) for all blocks of DRAM must be set to "1".<br>In summary:<br>CPWDBL = "1", Make CAS pulse width = 7 or 8 CLK2s for page miss and RAS high read cycles for all blocks of DRAM.<br>CPWDBL = "0", CAS pulse width for page miss and RAS high read cycles determined by CPWXX bits for each block of DRAM. |
| PI2WAYAB, PI2WAYCD. PI4WAY (Page interleave modes) | These programmable bits define the type of page interleaving performed. When PI2WAYAB = "1", blocks A & B will be interleaved; if PI2WAYCD = "1", blocks C & D will be interleaved; if PI4WAY = "1", blocks A,B,C,D will be interleaved. If PI4WAY = "1", PI2WAYAB & |

TABLE 1-continued
PROGRAMMABLE OPTION BITS

| | |
|---|---|
| | PI2WAYCD must be programmed to a "0". If any page interleave bit is set, only 4 DRAM banks are allowed (1 for each block) and the user must program the blocks to contain only 1 bank, not 2. In addition, the starting address for all interleaved blocks must be set to the same value.<br>Programmable interdependencies.<br>When PI4WAY = "1", PI2WAYAB & PI2WAYCD must be programmed to "1"; if PI2WAYAB and/or PI2WAYCE = "1", PI4WAY must be programmed to "0". When PI4WAY or PI2WAYAB or PI2WAYCD = "1" (any interleaving), CASENMD must be set to a "1".<br>In summary:<br>PI2WAYAB = "1", Page interleave blocks A,B.<br>PI2WAYCD = "1", Page interleave blocks C,D.<br>PI4WAY = "1", Page interleave blocks A,B,C,D.<br>PI2WAYAB, PI2WAYCD, PI4WAY = "0", No page interleave. |
| RASUP (Pull RAS high after each DRAM cycle) | This programmable option is used to enable the page mode and in its opposite state ("1") emulates the old 82C351 RAS/CAS cycles. When RASUP = "1", the DRAM controller will perform only traditional RAS/CAS cycles to DRAM memory. When RASUP = "0", the DRAM controller will perform page mode cycles to DRAM memory. The intent of such a mode is to be able to use the existing 82C351 test patterns (with a minimum number of modifications) to test the P1386 and to enable users to run only RAS/CAS cycles. In addition, when a cache test is being performed, RASUP must be programmed to a "1" so that only RAS/CAS cycles will be used. The controller can not perform the cache tests in page mode.<br>Programmable interdependencies.<br>The user will not be able to run traditional RAS/CAS cycles (by simply setting RASUP to a "1") using aggressive (MPC) settings. (tRAS, tRSH will be violated). The user must program more conservative settings for the DRAM timing parameters when using RASUP = "1". RASUP must = "1" when cache tests are being performed.<br>In summary:<br>RASUP = "1", Do traditional RAS/CAS DRAM cycles.<br>RASUP = "0", Do page mode DRAM cycles. |
| RCD3 (RAS to CAS delay) | This programmable option determines the number of CLK2s between RAS active and CAS active. When RCD3 = "1", RAS and CAS will be separated by 3 CLK2s, otherwise by 2 CLK2s. The A mux will change address data in the center of this time in either case. When programmed as a "1", margins for the row address hold time (tRAH) and column address setup time (tASC) will be improved. In general, this bit would be programmed as a "1" for 33 Mhz. or 40 Mhz. operation. |
| T1PRAS (RAS active at the beginning of T1P/T2 state) | This configuration bit was added specifically to enable 80 ns DRAMs to run in the MPC configuration. This option enables more access time (tRAC) for a RAS high cycle. This type of configuration, (MPC used with 80 ns DRAMS), is the most aggressive configuration available. Internal critical paths limit the usefulness of this mode by reducing the required KF process factor for proper operation.<br>Programmable interdependencies.<br>T1PRAS should be programmed as a "1" for the MPC using 80 ns DRAMS. (60 ns DRAMs could be used also). If TLPRAS = "1", the KF factor will be reduced, resulting in product "fallout". T1PRAS can be programmed to a "0", if 60 ns DRAMs are used, without impacting the system margins. |
| L2CAS (Late, late CAS | Adds 1 waitstate to page miss and RAS high write cycles.<br>Programmable interdependencies. |

TABLE 1-continued

PROGRAMMABLE OPTION BITS

| | |
|---|---|
| mode for write page miss) | When NLTCAS = "1" (early CAS write), L2CAS must be programmed as a "1", therefore the combination NLTCAS = "1", L2CAS = "0", is an illegal condition and must not be used.<br>When NLTCAS = "0", if L2CAS = "1", one SYSCLK will be added to the write cycle time and the CAS pulse will be 2 CLK2s wide. If L2CAS = "0", no time will be added to the write cycle time and the CAS pulse width will be 2 CLK2s wide. When DBLCAS = "1", NLTCAS must be set to a "0"; however L2CAS may be programmed as a "0" or "1". If the cycle is a write page cycle, the CAS pulse width will be 4 CLK2s and will introduce 2 additional SYSCLKs (from early CAS timings, MPC) to the write cycle time. If the cycle is a write miss or RAS high cycle; then if L2CAS = "1", the CAS pulse width will be 4 CLK2s and will introduce 2 additional SYSCLKs of time to the write cycle; otherwise, if L2CAS = "0", 4 CLK2s wide and 1 additional SYSCLK of time. |
| OLD351 | This option programs an alternate set of precharge values. When OLD351 = "1", the available RAS precharge values are 4,6,6,6 CLK2s. When OLD351 = "0", the available values are 3,4,5,6 CLK2s. |

TABLE 2

STATE MACHINE EQUATIONS

| | |
|---|---|
| TR1 = | [((TRIGSM + (TRIGSME * T1PRAS)) * DRAMST) + (PEND * SYSCLKN)] * (RASHI * TRPOK * NDBZREF) |
| TPC = | [(TRIGSM * DRAMST) + (PEND * SYSCLKN)] * NDBZREF * [(WR * NDISWE) + (RD * (HITN + NCACENA))] DRAMST = ENDRAM * [(WR * NDISWE) + (RD * (HITN + NCACENA))] |
| TRCH = | [(TRIGSM * DRAMST) + PEND] * NDBZREF * LRASHIT * LCPURD * RASLO DRAMST = ENDRAM * (HITN + NCACENA) |
| TWCH = | [(TRIGSM * TTWO * DRAMST) + (PEND * SYSCLKNO] * LRASHIT * LCPUWT * RASLO * NDBZREF DRAMST = ENDRAM * NDISWE |
| TC1 = | LDRD * TR3 |
| TWCR = | LDWR * SYSCLK * L2CAS * TR3 |
| TWC1 = | (LDWR * SYSCLKN * TR3) + TWCR |
| TWC2 = | (LDWR * SYSCLK * NL2CAS * TR3) + (TWC1 * LATECAS) + (TWCH * LATECAS) |
| TR2 = | RCD3 * (TR1 + TPCR1) |
| TR3 = | TR2 + [NRCD3 * (TR1 + TPCR1)] |
| TWC3 = | TWC2 |
| TC2 = | TRCH + TC1 |
| TC3 = | TC2 |
| TC4 = | (TC3 * SYSCLK * NDRMRDY) + (TC3 * SYSCLKN) |
| TC5 = | (TC4 * SYSCLK * NDRMRDY) + (TC4 * SYSCLKN) |
| TC6 = | TC5 * SYSCLKN |
| TPC2 = | NTRPOK * (TPC + TPC2) |
| TPCR1 = | TRPOK * (TPC + TPC2) |

| L2CAS | LTCAS | |
|---|---|---|
| 0 | 0 | NOT ALLOWED |
| 0 | 1 | LTCAS |
| 1 | 0 | EARLY CAS |
| 1 | 1 | LTCAS AND L2CAS WILL ADD W.S. IF POSSIBLE |

TABLE 3

STATE MACHINE VARIABLES

| | |
|---|---|
| TRIGSM = trigger state machine | TRIGSME = trigger state machine early |
| DRAMST = DRAM start decode | PEND = pending cycle |
| TRPOK = time for RAS precharge OK | NDBZREF = not DRAM busy or refresh |
| ENDRAM = enable DRAM | RD = read |
| WR = write | NDISWE = not disable write enable (write protect) |
| HITN = not hit | NCACENA = not cache enable |
| LRASHIT = latched ras hit | LCPURD = latched CPU read |
| TTWO = T2 in CPU | LCPUWT = latched CPU write |
| LDRD = latched DRAM read | LDWR = latched DRAM write |

TABLE 3-continued

STATE MACHINE VARIABLES

What is claimed is:

1. In a microprocessor system including a microprocessor operating according to a first clock, and having a component controller operating according to a second clock having a frequency m times the frequency of the first clock, an apparatus for synchronizing said component controller to said first clock at the completion of a component access cycle comprising:

means, coupled to a state machine of said component controller, and adapted to receive signals identifying an n-1 through n-m states of a component access cycle having n state transitions, for sampling for said n-1 through n-m states on a given edge of said first clock; and means, coupled to said means for sampling, for asserting a ready signal having a period of at least one first clock pulse to synchronize said component controller to said first clock, when one of said n-1 through n-m states is detected.

2. The component controller of claim 1 wherein said component is a DRAM.

3. In a microprocessor system including a microprocessor operating according to a first clock, and having a component controller operating according to a second clock having twice the frequency of the first clock, an apparatus for synchronizing said component controller to said first clock at the completion of a component access cycle comprising:

means, coupled to a state machine of said component controller and adapted to receive signals, for identifying an n-1 and n-2 states of a component access cycle having n state transitions, for sampling at said n-1 and n-2 states on a given edge of said first clock; and means, coupled to said means for sampling, for asserting a ready signal having a period of at least one first clock pulse to synchronize said component controller to said first clock, when one of said n-1 and n-2 states is detected.

4. The component controller of claim 3 wherein said component is a DRAM.

5. In a microprocessor system operating according to a first clock, a controller device for controlling a system component comprising:
- a programmable register for storing a plurality of variables, wherein said variable describe a given set of timing options;
- a state machine that transitions through a series of states to output a plurality of timing signals to said system component, and coupled to said programmable register, to said system component and to a second clock having a frequency different from said first clock; and
- a ready circuit, coupled to said first clock, aid state machine and said programmable register, for sampling said series of states and for asserting a ready signal when a specified state is detected on a given edge of said first clock to synchronize said state machine with said first clock at the end of a component access cycle.

6. The component controller of claim 5 wherein said component is a DRAM.

7. In a microprocessor system including a microprocessor operating according to a first clock and a system component, a component controller comprising:
- means for storing a given set of component timing options;
- a state machine for transitioning through a series of states to output a plurality of timing signals to said system component and coupled to said means for storing and to a second clock having a frequency m times the frequency of the first clock; and
- an apparatus for synchronizing said component controller to said first clock at the completion of a component access cycle having:
  - (i) means, coupled to a state machine of said component controller and adapted to receive signals, identifying an n-1 through n-m states of a component access cycle having n state transitions,
  - for sampling at each of said n-1 through n-m states on a given edge of said first clock; and
  - (iii) means, coupled to said means for sampling, for asserting a ready signal having a period of at least one first clock pulse to synchronize said component controller to said first clock, when one of said n-1 through n-m states is detected.

8. The component controller of claim 7 wherein said component is a DRAM.

9. In a microprocessor system including a microprocessor operating according to a first clock, and having a component controller operating according to a second clock having a frequency m times the frequency of the first clock, a method for synchronizing said component controller to said first clock at the completion of a component access cycle comprising:
- identifying an n-1 through n-m states of a component access cycle having n state transitions;
- sampling for each of said n-1 through n-m states on a given edge of said first clock; and
- asserting a ready signal having a period of at least one first clock pulse to synchronize said component controller to said first clock, when one of said n-1 through n-m states is detected.

10. In a microprocessor system including a microprocessor operating according to a first clock, and having a component controller operating according to a second clock having twice the frequency of the first clock, a method for synchronizing said component controller to said first clock at the completion of a component access cycle comprising:
- identifying an n-1 and n-2 states of a component access cycle having n state transitions;
- sampling for said n-1 and n-2 states on a given edge of said first clock; and
- asserting a ready signal having a period of at least one first clock pulse to synchronize said component controller to said first clock, when one of said n-1 through n-2 state is detected.

11. In a microprocessor system including a microprocessor operating according to a first clock and a system component, a method for operating a component controller comprising the steps of:
- storing a given set of component timing options;
- transitioning through a series of states using a state machine to output a plurality of timing signals to said system component according to said given set of timing options;
- operating said state machine using a secondary clock having a frequency m times the frequency of the first clock; and
- synchronizing said component controller to said first clock at the completion of a component access cycle wherein said step of synchronizing includes the steps of:
  - (i) identifying an n-1 through n-m states of a component access cycle having n state transitions;
  - (ii) sampling for each of said n-1 through n-m states on a given edge of said first clock; and
  - (iii) asserting a ready signal having a period of at least one first clock pulse to synchronize said component controller to said first clock, when one of said n-1 through n-2 states is detected.

* * * * *